United States Patent
Sutardja

(10) Patent No.: US 7,855,909 B1
(45) Date of Patent: Dec. 21, 2010

(54) CALIBRATING PAGE BORDERS IN A PHASE-CHANGE MEMORY

(75) Inventor: Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/050,604

(22) Filed: Mar. 18, 2008

Related U.S. Application Data

(60) Provisional application No. 60/910,968, filed on Apr. 10, 2007.

(51) Int. Cl.
*G11C 11/00* (2006.01)
(52) U.S. Cl. .................... 365/148; 365/163
(58) Field of Classification Search .......... 365/148, 365/158, 163, 171, 173
See application file for complete search history.

(56) References Cited

U.S. PATENT DOCUMENTS

| | | | | |
|---|---|---|---|---|
| 4,876,668 A | * | 10/1989 | Thakoor et al. | 365/163 |
| 7,038,935 B2 | * | 5/2006 | Rinerson et al. | 365/163 |
| 7,280,390 B2 | * | 10/2007 | Kostylev et al. | 365/163 |
| 7,342,817 B2 | * | 3/2008 | Govyadinov et al. | 365/163 |
| 7,411,818 B1 | * | 8/2008 | Elmegreen et al. | 365/163 |
| 7,423,901 B2 | * | 9/2008 | Sutardja | 365/163 |

OTHER PUBLICATIONS

U.S. Appl. No. 11/986,520, filed Nov. 21, 2007, Sutardja.

* cited by examiner

*Primary Examiner*—Trong Phan

(57) ABSTRACT

A phase-change memory system includes an array of phase-change memory cells, an amplifier that amplifies a data signal read from a selected one of the phase-change memory cells, and a gain estimation module that adjusts a gain of the amplifier based on a gain parameter that is associated with the selected one of the phase-change memory cells. The gain parameter is based on a number of bits that are represented by the selected one of the phase-change memory cells.

30 Claims, 12 Drawing Sheets

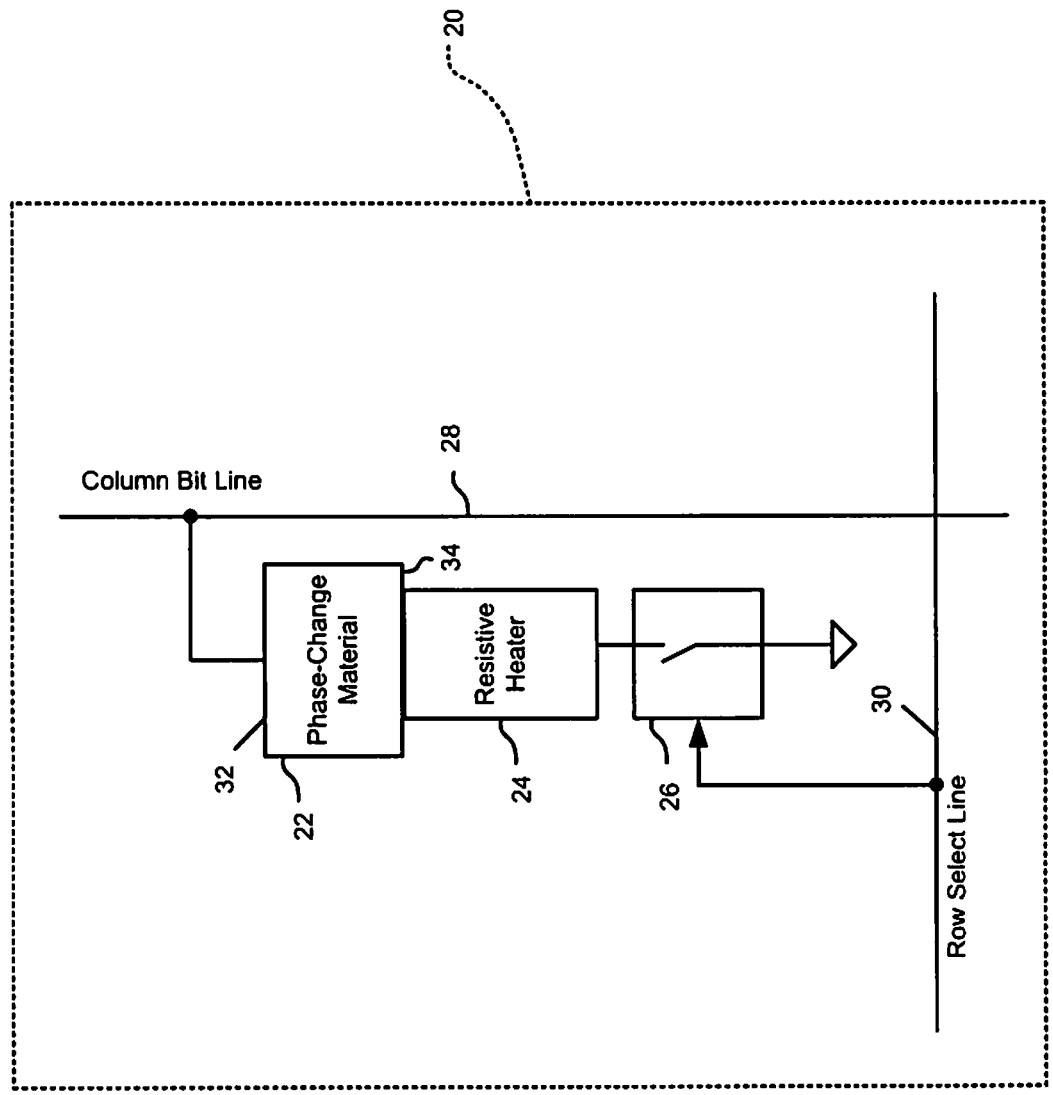

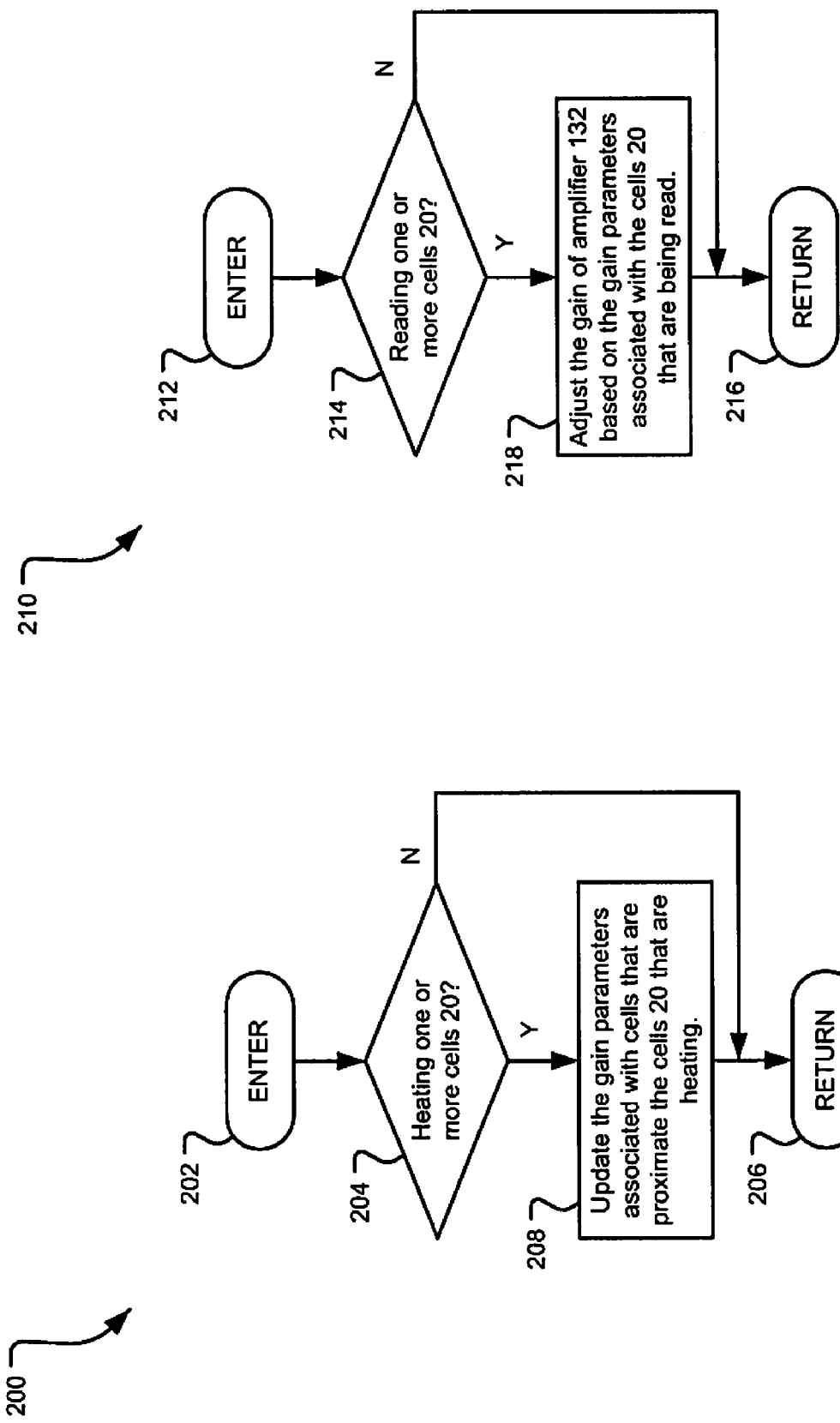

CALIBRATING PAGE BORDERS IN A PHASE-CHANGE MEMORY

CROSS-REFERENCE TO RELATED APPLICATIONS

This application claims the benefit of U.S. Provisional Application No. 60/910,968, filed Apr. 10, 2007. The disclosure of the above application is incorporated herein by reference in its entirety.

FIELD

The present disclosure relates to memory modules and, more particularly, to calibration systems for multi-state phase-change memory.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Phase-change materials have been proposed for use in memory devices. Phase-change materials may be electrically programmed between various states. These states range from fully amorphous to fully crystalline. In a fully crystalline state, the phase-change material exhibits a low resistance. In a fully amorphous state, the phase-change material exhibits a high resistance. Interim resistance values may be provided by states between fully amorphous and fully crystalline. Phase-change materials may be used as memories by varying the resistance of the phase-change material. Each memory location can then represent one or more bits of binary data. The states of the phase-change material can be varied by holding the phase-change material at predetermined temperatures for corresponding predetermined times.

SUMMARY

A phase-change memory system includes an array of phase-change memory cells, an amplifier that amplifies a data signal read from a selected one of the phase-change memory cells, and a gain estimation module that adjusts a gain of the amplifier based on a gain parameter that is associated with the selected one of the phase-change memory cells. The gain parameter is based on a number of bits that are represented by the selected one of the phase-change memory cells.

In other features the gain parameter includes at least one of data signal magnitude and resistance. Each of the phase-change memory cells includes a heater and the gain parameter is based on activating a heater of a phase-change memory cell other than the selected one of the phase-change memory cells being exposed to more heat than others ones of the phase-change memory cells. The gain parameter can be based on an amount of time that the heater is activated. The gain parameter can be based on a number of times that the heater is activated. The gain parameter can be based on estimated heat that is transferred to the selected one of the phase-change memory cells.

In other features the phase-change memory cells are divided into contiguous groups and the selected one of the phase-change memory cells is positioned on a boundary between at least two of the contiguous groups. The gain parameter can be based on the proximity of the boundary to the selected one of the phase-change cells. The phase change memory system can also include a select module that selects a row of the array and selects the phase-change cells within columns of the selected row. The phase change memory system can also include a select module that selects a column of the array and that selects the phase-change cells within rows of the selected column.

A method of reading data from an array of phase-change memory cells includes amplifying a data signal read from a selected one of the phase-change memory cells and adjusting a gain of the amplification based on a gain parameter that is associated with the selected one of the phase-change memory cells. The gain parameter is based on a number of bits that are represented by the selected one of the phase-change memory cells.

In other features the gain parameter includes at least one of data signal magnitude and resistance. The gain parameter can be based on the selected one of the phase-change memory cells being exposed to more heat than other ones of the phase-change memory cells. The gain parameter can be based on the duration of the heat exposure. The gain parameter can be based on a number of times that the other ones of the phase-change memory cells are programmed. The gain parameter can be based on estimated heat that transfers to the selected one of the phase-change memory cells.

In other features the method includes assigning the phase-change memory cells to respective contiguous groups. The selected one of the phase-change memory cells is positioned on a boundary between at least two of the contiguous groups. The gain parameter can be based on the proximity of the boundary to the selected one of the phase-change cells. The method includes selecting a row of the array and selecting the phase-change cells within columns of the selected row. The method includes selecting a column of the array and selecting the phase-change cells within rows of the selected column.

A phase-change memory system includes phase-change memory cell means for storing data, amplifier means for amplifying a signal from the phase-change memory cell means, and gain means for adjusting a gain of the amplifier means based on a gain parameter that is associated with a selected one of the phase-change memory cell means. The gain parameter is based on a number of bits that are represented by the selected one of the phase-change memory cell means.

In other features the gain parameter includes at least one of data signal magnitude and resistance. Each of the phase-change memory cell means includes heater means for heating respective phase-change memory cells and the gain parameter is based on the selected one of the phase-change memory cells being exposed to more heat than other ones of the phase-change memory cells. The gain parameter can be based on an amount of time that the heater means is activated. The gain parameter can be based on a number of times that the heater means is activated. The gain parameter can be based on estimated heat that is transferred to the selected one of the phase-change memory cells. The phase-change memory cells are divided into contiguous groups and the selected one of the phase-change memory cells is positioned on a boundary between at least two of the contiguous groups. The gain parameter is based on the proximity of the boundary to the selected one of the phase-change cells. The phase-change memory cell means includes rows and columns of phase-change memory and further comprises select means for selecting a row of the phase-change memory and for selecting the phase-change memory within columns of the selected row. The phase-change memory cell means includes rows and columns of phase-change memory cells and further comprises select means for selecting a column of the array and for selecting the phase-change cells within rows of the selected column.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A is a functional block diagram of an exemplary phase change memory cell;

FIG. 7A illustrates steps of a method for erasing and/or writing contents to a phase-change memory cell;

FIG. 7B illustrates steps of a method for reading contents from a phase-change memory cell;

DETAILED DESCRIPTION

Figure 1:
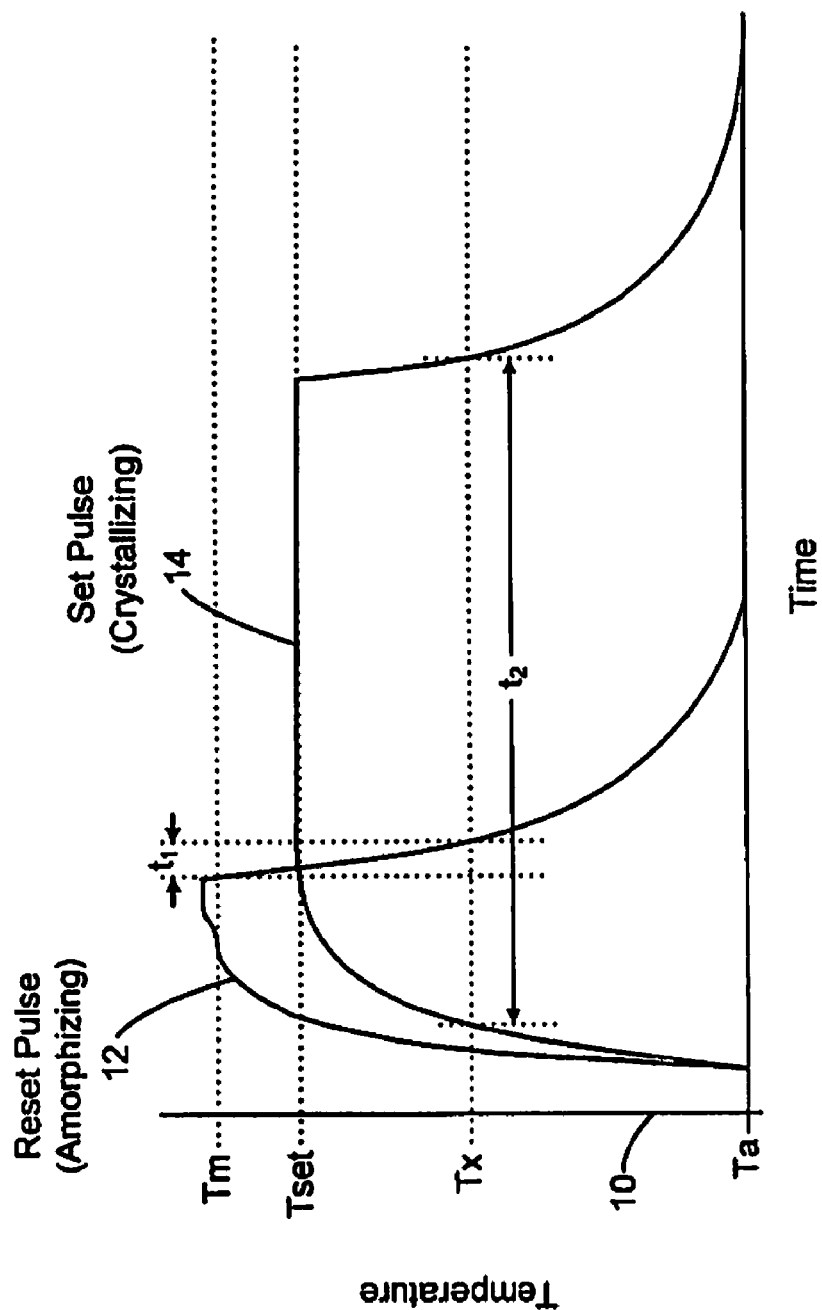
FIG. 1 is graph of a temperature profile for formation of amorphous and crystalline states of phase change materials.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. It should be understood that steps within a method may be executed in a different order without altering the principles of the present disclosure.

The present disclosure is directed to systems and methods for accurately writing and reading multi-level values into a memory array including phase-change memory cells. The memory array may be used in electronic devices including portable electronic devices, such as cell phones, laptop computers, personal digital assistants (PDAs), hand-held gaming devices, portable music players, portable video players, and the like.

Referring now to FIG. 1, a phase-change memory cell including a phase change material such as chalcogenide alloy and/or other suitable material can be programmed using a temperature profile 10. On a left side of the temperature profile 10, resistance of the material remains substantially constant (i.e., in its high resistance or RESET state) until a current pulse of sufficient energy is applied. The material is then transformed from its high resistance (RESET) state to its low resistance (SET) state. A current pulse that is sufficient to program the memory cell from the high resistance state to the low resistance state is referred to as a "set pulse". The set pulse changes at least a portion of the phase-change material from a less-ordered amorphous state to a more-ordered crystalline state, and may therefore be referred to as a "crystallizing" set pulse.

In graph 12 of the temperature profile 10, to convert the material to an amorphous state, the temperature of the material is raised above a melting temperature (Tm) and allowed to cool down quickly, i.e., t1. The rapid cool down locks the phase change material in an amorphous state. Graph 12, which converts the phase change material to an amorphous state, may be referred to as an "amorphizing" reset pulse.

In graph 14 of the temperature profile 10, for crystallizing, the material is heated up to a temperature $T_{set}$ that is below the molten state $T_m$ but above the crystallization temperature $T_x$. A prolonged period at $T_{set}$ allows the material to re-order itself to its crystalline state. Generally, completion of the crystalline process requires a predetermined period of time $t_2$ as shown in FIG. 1.

Figure 2:
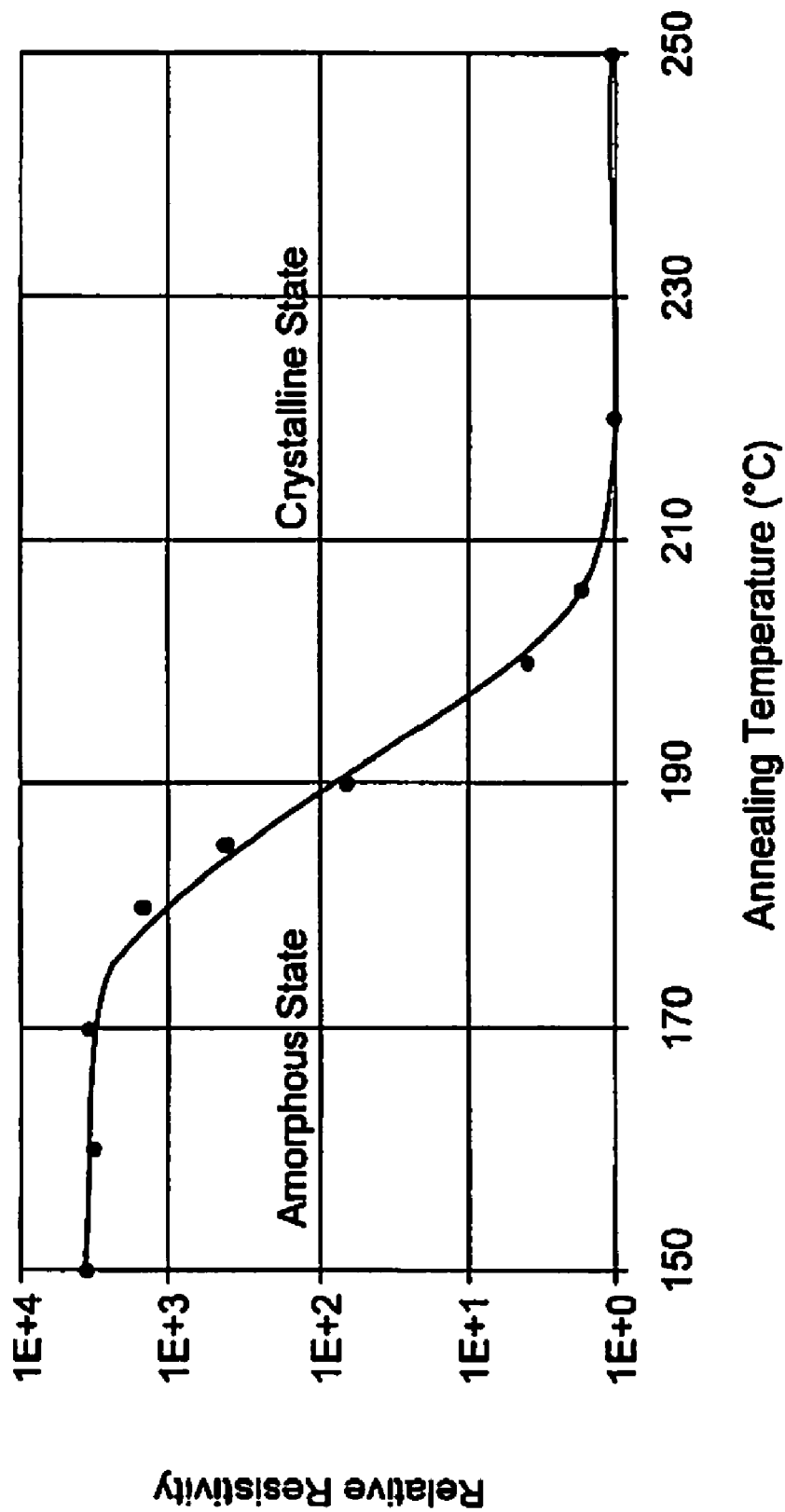
FIG. 2 is a graph of relative resistance when an amorphous state phase-change material is annealed.

Referring now to FIG. 2, if the phase-change material is annealed at a different temperature, intermediate resistance values between the crystalline and amorphous state can be obtained. FIG. 2 shows that, as annealing temperature increases, relative resistance tends to decrease. Annealing temperatures at the left side of FIG. 2 correspond to an increasingly amorphous state, while annealing temperatures at the right side of FIG. 2 correspond to an increasingly crystalline state. Further, because partial crystallization is possible, control of crystallization time during a write process allows multi-level writing. In other words, each cell can store additional states and N can be greater than 2. For partial crystallization control, the phase-change material is RESET. Then, instead of rapidly dropping the temperature to a value below Tx, as in graph 12, the temperature is decreased to the Tset value and held for a predetermined period t2, similar to graph 14. The value of t2 determines the extent of crystallization. Another approach for partial crystallization is to drop the temperature after reaching the Tm value to a programmable Tset value for a predetermined period T2.

While a write current pulse and duration controls a temperature profile, there are at least two limitations. First, process, material, and pattern formation non-uniformities can cause the memory cells to have slightly different programmed resistance values for a given temperature profile (or write parameter). Second, with resistance changes over several orders of magnitude, it may be difficult to read-back the resistance value with sufficient dynamic range and accuracy.

Figure 3B:
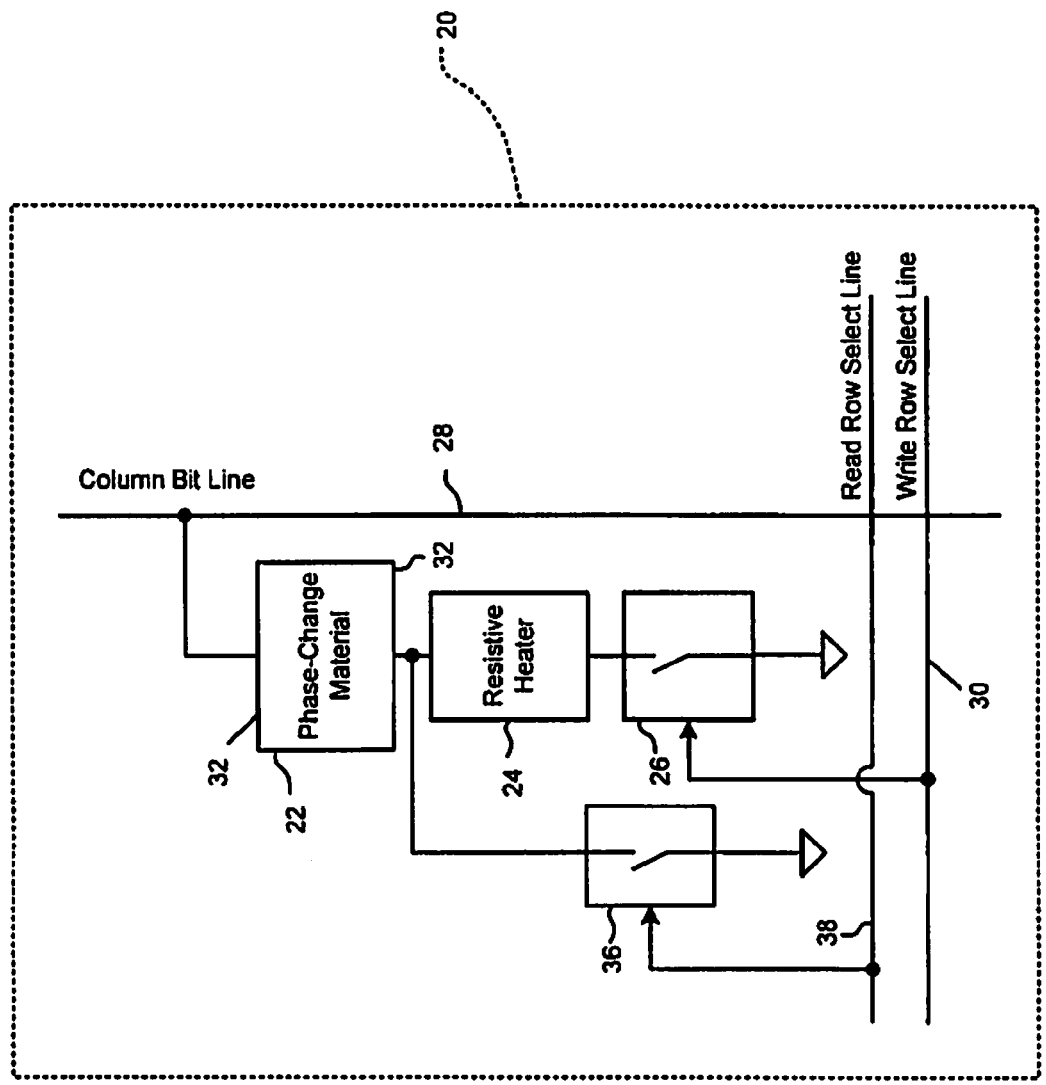
FIG. 3B is a functional block diagram of another phase change memory cell.
Figure 4:
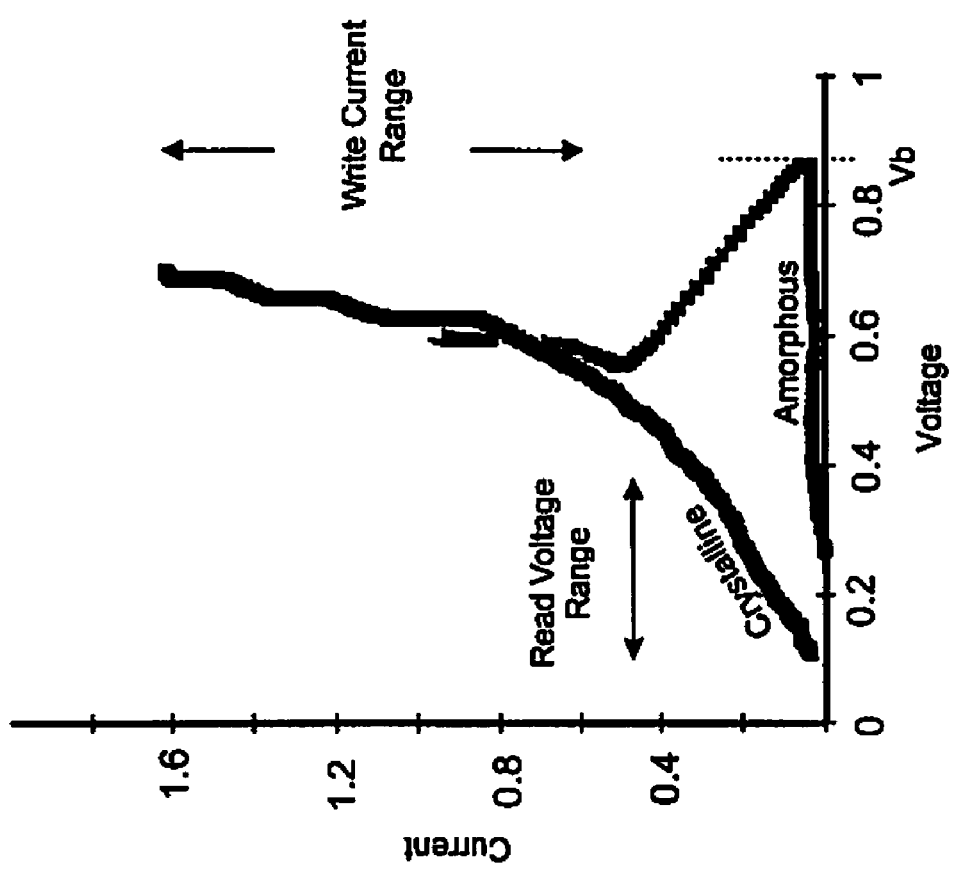
FIG. 4 is a graph of current and voltage characteristics of a phase-change material.

Referring now to FIGS. 3A, 3B, and 4, exemplary memory cells are illustrated. In FIG. 3, a memory cell 20 includes a phase-change material 22. A heater 24 and a select switch 26 are connected in a row and column orientation. The heater 24 can be a resistive heater. The memory cell 20 may be located at an intersection of a column bit line 28 and row select line 30. One end 32 of the material 22 is connected to the column bit line 28. Another end 34 is connected to the resistive heater 24, which is selectively connected by the switch 26 to a reference potential such as ground. The switch 26 is controlled by the row select line 30. The resistive heater 24 may include an inert electrical heater cell.

Referring now to FIG. 3B, another select switch 36 may be controlled by a read row select line 38. The row select line 30 is then used for writing, and is labeled as write row select line 30 in FIG. 3B. This approach eliminates the resistive heater 24 from a read operation but increases cell size. Reading the phase-change memory cell may include applying current and/or measuring voltage to determine resistance.

Referring now to FIG. 4, current and voltage (I/V) characteristics of a phase-change material are shown. In addition, the I/V characteristic curve shows read voltage and write current ranges. Due to material break-down characteristics, a substantial amount of current may be conducted by applying a voltage exceeding the breakdown voltage ($V_b$) of the material. Current flowing through the material may be adjusted to control heating.

A rise in temperature from both heating and power dissipated within the phase-change material provides controlled temperature cycling used for writing the phase-change memory cell. Because of the break-down characteristics of the phase-change material, the read-back process may be performed at an applied voltage lower than the breakdown voltage.

Figure 5:
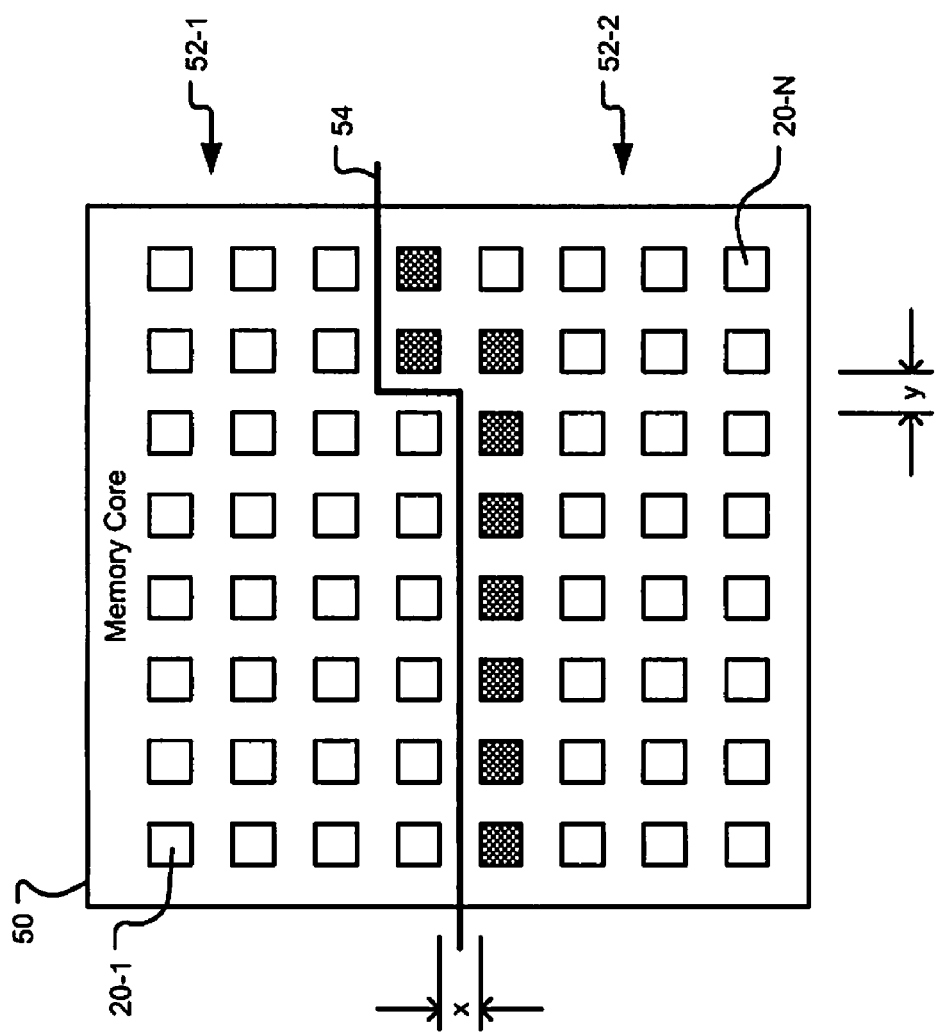
FIG. 5 is a functional block diagram of a phase-change memory core.

Referring now to FIG. 5, a memory core 50 is shown. The memory core 50 includes N memory cells 20-1 . . . 20-N, referred to collectively as memory cells 20, where N is a positive integer. The memory cells 20 can be grouped into one or more pages, such as a first page 52-1 and a second page 52-2, referred to collectively as pages 52. An imaginary boundary line 54 indicates adjacent portions of the pages 52.

It is possible that the pages 52 are each used for different purposes. By way of non-limiting example, the first page 52-1 can store digital data such as digital music and/or photographs. The second page 52-2 can store computer instructions such as firmware. In such an application, the digital data in the first page 52-1 will likely change from time to time, whereas the firmware in the second page 52-2 will likely stay the same for a long time compared to the digital data.

If the first page 52-1 is bulk-erased then each of its cells 20 briefly heat to a high temperature, such as Tm of FIG. 1, to change the state of the phase-change material. Some of this heat can propagate across the boundary line 54 and affect the resistance of the cells 20 that are in the second page 52-2 and lie along the boundary line 54. The affected cells 20 are shaded in FIG. 5. Each time the first page 52-1 is erased, the affected cells 20 can be inadvertently heated and change state to some degree. The degree of inadvertent heating can be based on a number of factors, such as distances x and y between the cells 20, thermal properties of the materials used for the memory core 50, and the amount of time that the resistive heaters 24 are turned on.

Figure 6:
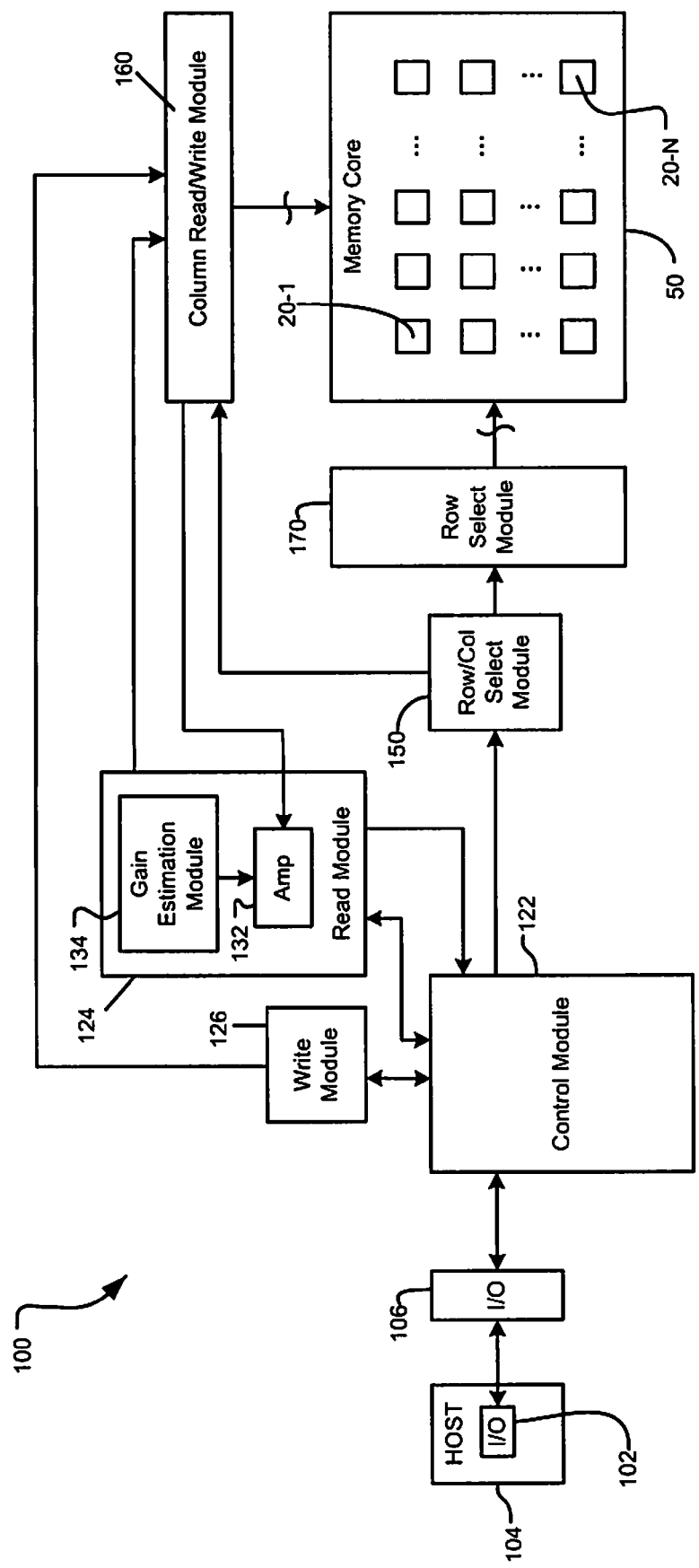
FIG. 6 is a functional block diagram of an exemplary memory module including boundary calibration.

Referring now to FIG. 6, a memory module 100 or phase-change memory system is illustrated. The memory module 100 includes features that compensate for the aforementioned effects of inadvertent heating. The memory module 100 is capable of being read from and written to by an input/output (I/O) module 102 of a host device 104 through a memory I/O module 106. The memory module 100 includes the memory core 50 and its multiple phase-change memory cells 20. Each of the memory cells 20 may be programmable to a plurality of resistance states.

A control module 122 receives control signals from the host device 104 and controls a read module 124, a write module 126, and a row/column select module 150. The row/column select module 150 outputs select signals to a column read/write module 160 and a row select module 170 to select one or more of the phase change cells 20.

During a write or erase operation, the control module 122 instructs the row/column select module 150 (and the column and row select modules 160 and 170) to select write target cells 20 for the write procedure. The target cells 20 may include any number of cells 20, such as a particular cell, a row of cells, a column of cells, a block or page of cells, etc. Once the target cells 20 are selected, the control module 122 instructs the write module 126 to generate a write signal having a first parameter. The write target cells 20 are written to using the first parameter. The first parameter may be a default value for the initial write process.

During a read operation, the control module 122 instructs the row/column select module 150 to select read target cells 20 for the read procedure. The read target cells 20 may include any number of cells 20, such as a particular cell 20, a row of cells 20, a column of cells 20, a block of cells 20, etc. Once the read target cells 20 are selected, the control module 122 instructs the read module 124 to generate a read signal. An amplifier 132 in the read module 124 senses a signal that is based on the stored value in the target cells 20.

The amplifier 132 has a variable gain that is set by a gain estimation module 134. The variable gain allows the read module 124 to accurately read data from cells 20 despite the resistances of the cells 20 being slightly changed by heat from neighboring cells 20. This change can be most pronounced when the cell 20 that is being read belongs to second page 52-2 (shown in FIG. 5), is positioned along the boundary line 54, and the cells 20 of first page 52-1 have been simultaneously erased (i.e. heated) a number of times since the data was written to the cell 20 that is being read. The gain estimation module 134 estimates the cumulative effect of the neighboring thermal events on the resistance of the cell 20 that is being read. The gain estimation module 134 then sets the gain of amplifier 132 to compensate for the cumulative effect. In particular applications the cumulative effects can be simulated and/or observed through experiments. When the cumulative effects are known, the gain estimation module 134 can store gain parameters that are associated with respective ones of the cells 20.

Referring now to FIG. 7A, a method 200 is illustrated for updating the gain parameters that are associated with respective cells 20. The method 200 can be executed when one or more cells 20 are erased or written. The method 200 can be implemented by the control module 122, the gain estimation module 134, and/or any other module capable of performing the requisite steps. Control enters at block 202 and immediately proceeds to a decision block 204. In decision block 204, control determines whether one or more cells 20 are being heated. If not, then control branches to exit block 206. If one or more cells 20 are being heated, such as during an erase or write operation, then control branches to block 208. In block 208 control updates the gain parameters of respective cells 20 that are proximate the cells 20 that are heating. The requisite proximity can be based on the degree of inadvertent heating that is discussed in association with FIG. 5. The updated gain parameters can be updated by a test calibration. Control then exits via block 206.

Referring now to FIG. 7B, a method 210 for determining the gain of amplifier 132 is illustrated. The method 210 can be executed when one or more cells 20 are read. The method 210 can be implemented by the gain estimation module 134 and/or any other module capable of performing the requisite steps. Control enters at block 212 and immediately proceeds to a decision block 214. In decision block 214, control determines whether one or more cells 20 are being read. If not, then control branches to exit block 216. On the other hand, if control determines, in decision block 214, that one or more cells 20 are being read then control branches to block 218. In block 218 control adjusts the gain of amplifier 132 based on the gain parameters of the cells 20 that are being read. Control then exits via block 216.

Figure 8B:
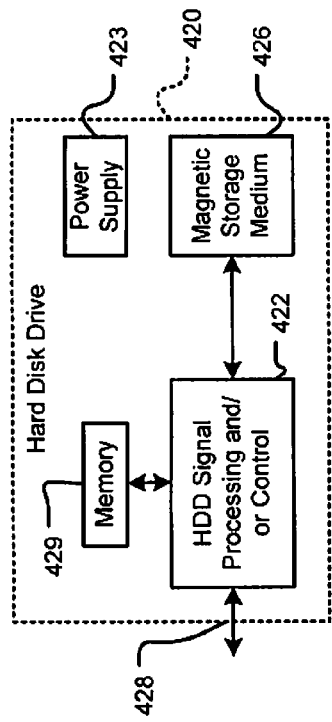
FIG. 8B is a functional block diagram of a hard disk drive (HDD)
Figure 8C:
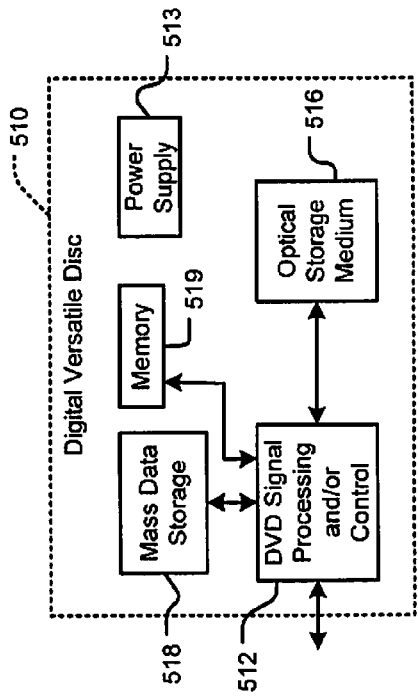
FIG. 8C is a functional block diagram of a digital versatile disk (DVD)
Figure 8A:
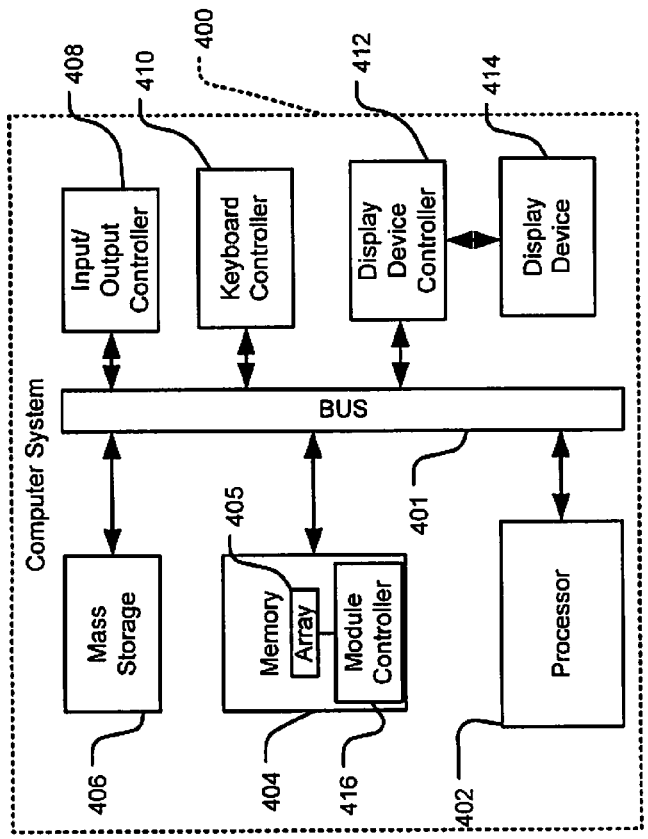
FIG. 8A is a functional block diagram of a laptop computer system.

Referring now to FIGS. 8A-8H, various exemplary implementations of the phase-change memory cell are shown. Referring now to FIG. 8A, the memory array can be implemented in memory 404 of a laptop computer system 400. The computer system 400 includes a processor 402 coupled through a bus 401 to memory 404 including a phase-change memory cell array 405 controlled by a module controller 416. The computer system 400 includes a mass storage device 406, which may also include a phase-change memory cell array. A keyboard controller 410 is connected to the bus 401 for receiving commands or data entered through a keyboard, mouse, or similar input device. A display device controller 412 is also connected to the bus 401 for providing output through an appropriately connected display device 414. Also connected to the bus 401 is an input/output controller 408 for interfacing the processor 402 with other devices, such as network interface devices and the like.

The computer system 400 may communicate with a host device (not shown) including mobile computing devices such as personal digital assistants (PDA), cellular phones, media or MP3 players and the like, and/or other devices via one or more wired or wireless communication links.

Referring now to FIG. 8B, the memory array can be implemented in memory 429 of a hard disk drive (HDD) 420. Memory 429 operates in conjunction with either or both signal processing and/or control circuits and/or a power supply 423, which are generally identified in FIG. 8B at 422. In some implementations, the signal processing and/or control circuit 422 and/or other circuits (not shown) in the HDD 420 may process data, perform coding and/or encryption, perform calculations, and/or format data that is output to and/or received from a magnetic storage medium 426.

The HDD 420 may communicate with a host device (not shown) such as a computer, mobile computing devices such as personal digital assistants, cellular phones, media or MP3 players and the like, and/or other devices via one or more wired or wireless communication links 428.

Referring now to FIG. 8C, the memory array can be implemented in memory 519 of a digital versatile disc (DVD) drive 510. The memory 519 operates in conjunction with either or both signal processing and/or control circuits, which are generally identified in FIG. 8C at 512, mass data storage 518 of the DVD drive 510 and/or a power supply 513. The signal processing and/or control circuit 512 and/or other circuits (not shown) in the DVD 510 may process data, perform coding and/or encryption, perform calculations, and/or format data that is read from and/or data written to an optical storage medium 516. In some implementations, the signal processing and/or control circuit 512 and other circuits (not shown) in the DVD 510 can also perform other functions such as encoding and/or decoding and/or any other signal processing functions associated with a DVD drive.

Figure 8E:
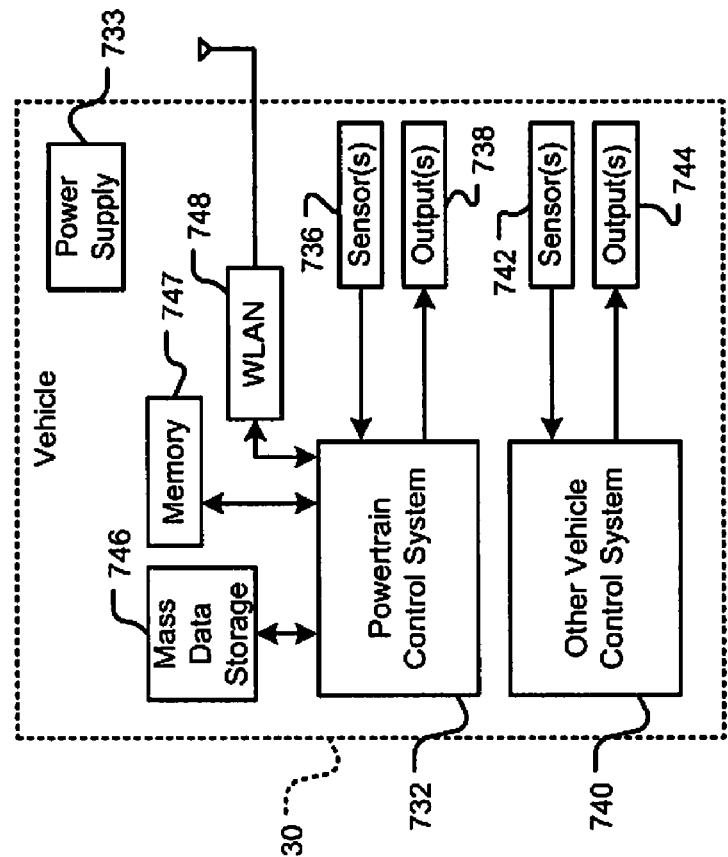
FIG. 8E is a functional block diagram of a vehicle control system.
Figure 8D:
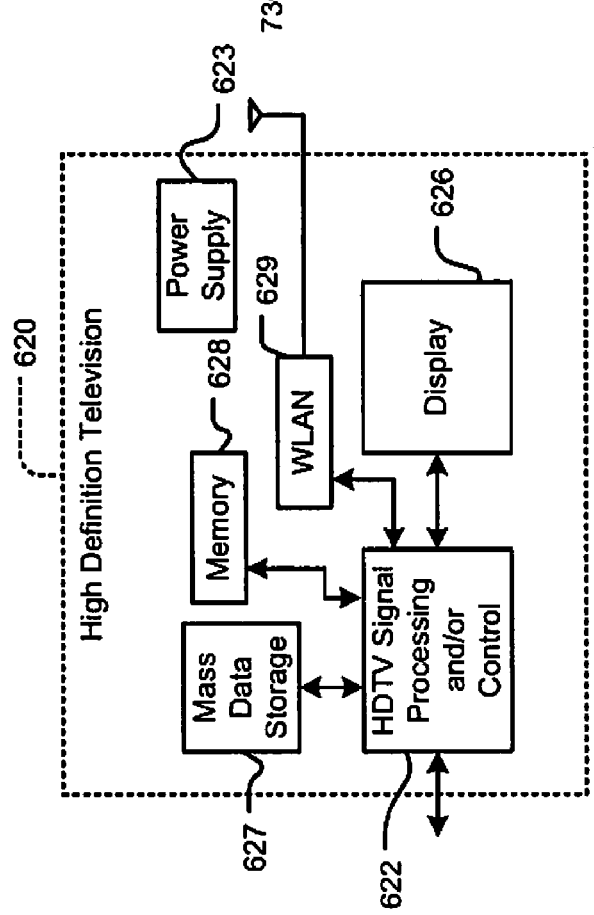
FIG. 8D is a functional block diagram of a high definition television.

Referring now to FIG. 8D, the memory array can be implemented in memory 628 of a high definition television (HDTV) 620. Memory 628 may implement and/or be implemented with either or both signal processing and/or control circuits, which are generally identified in FIG. 8D at 622, a WLAN interface, mass data storage of the HDTV 620 and/or a power supply 623. The HDTV 620 receives HDTV input signals in either a wired or wireless format and generates HDTV output signals for a display 626. In some implementations, signal processing circuit and/or control circuit 622 and/or other circuits (not shown) of the HDTV 620 may process data, perform coding and/or encryption, perform calculations, format data and/or perform any other type of HDTV processing that may be required.

The HDTV 620 may communicate with mass data storage 627, which also may include phase-change memory cells. The HDD may be a mini HDD that includes one or more platters having a diameter that is smaller than approximately 1.8". The HDTV 620 may be connected to memory 628. The HDTV 620 also may support connections with a WLAN via a WLAN network interface 629.

Referring now to FIG. 8E, the memory array may implement and/or be implemented in memory 747 of a vehicle control system 730. Memory 747 functions with a powertrain control system 732 that receives inputs from one or more sensors 736 such as temperature sensors, pressure sensors, rotational sensors, airflow sensors and/or any other suitable sensors and/or that generates one or more output control signals 738 such as engine operating parameters, transmission operating parameters, and/or other control signals.

The phase-change memory cell may also be implemented in other vehicle control systems 740. The control systems 740 may receive signals from input sensors 742 and/or output control signals to one or more output devices 744. In some implementations, the control systems 740 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 732 may communicate with mass data storage 746. The powertrain control system 732 may be connected to memory 747. The powertrain control system 732 also may support connections with a WLAN via a WLAN network interface 748. The control systems 740 may also include mass data storage, memory and/or a WLAN interface (all not shown). The vehicle control system 730 may include a power supply 733.

Figure 8F:
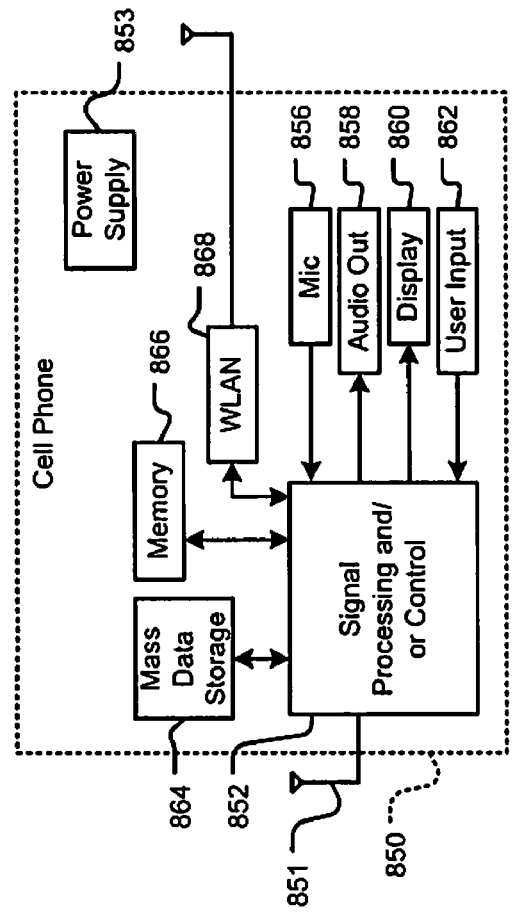
FIG. 8F is a functional block diagram of a cellular phone.

Referring now to FIG. 8F, the memory array can be implemented in memory 866 of a cellular phone 850 that may include a cellular antenna 851. Memory 866 may function with either or both signal processing and control circuits, which are generally identified in FIG. 8F at 852, a WLAN interface, mass data storage 864 of the cellular phone 850 and/or a power supply 853. In some implementations, the cellular phone 850 includes a microphone 856, an audio output 858 such as a speaker and/or audio output jack, a display 860 and/or an input device 862 such as a keypad, pointing device, voice actuation and/or other input device. The signal processing and/or control circuits 852 and/or other circuits (not shown) in the cellular phone 850 may process data, perform coding and/or encryption, perform calculations, format data and/or perform other cellular phone functions.

The cellular phone 850 may communicate with mass data storage 864, which may include phase-change memory cells. The cellular phone 850 also may support connections with a WLAN via a WLAN network interface 868.

Figure 8G:
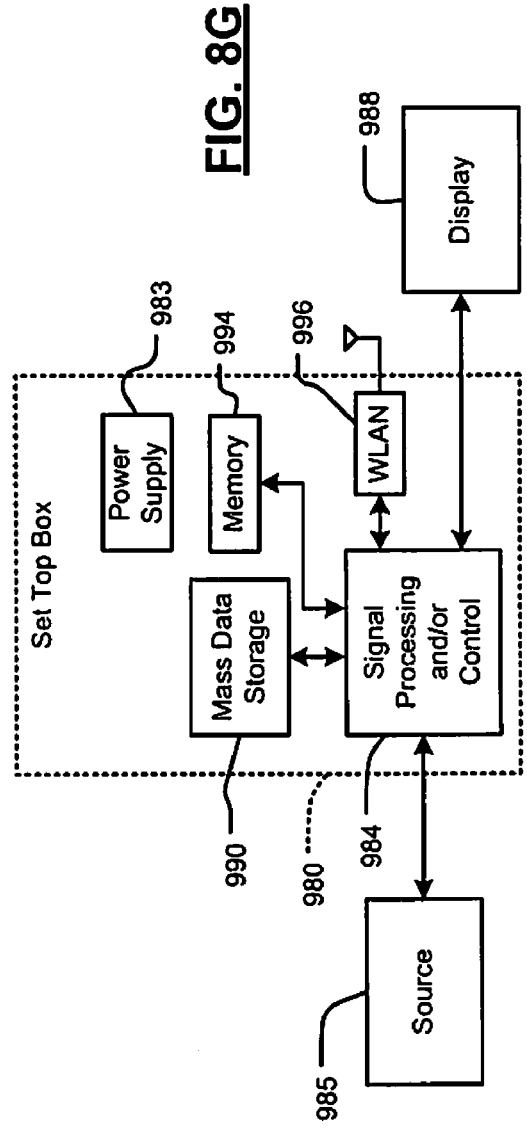
FIG. 8G is a functional block diagram of a set top box.

Referring now to FIG. 8G, the memory array can be implemented in memory 994 of a set top box 980. The memory 994 may function with either or both signal processing and/or control circuits, which are generally identified in FIG. 8G at 984, a WLAN interface, mass data storage of the set top box 980 and/or a power supply 983. The set top box 980 receives signals from a source 985 such as a broadband source and outputs standard and/or high definition audio/video signals suitable for a display 988 such as a television and/or monitor and/or other video and/or audio output devices. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include a phase-change memory cell array. The set top box 980 also may support connections with a WLAN via a WLAN network interface 996.

Figure 8H:
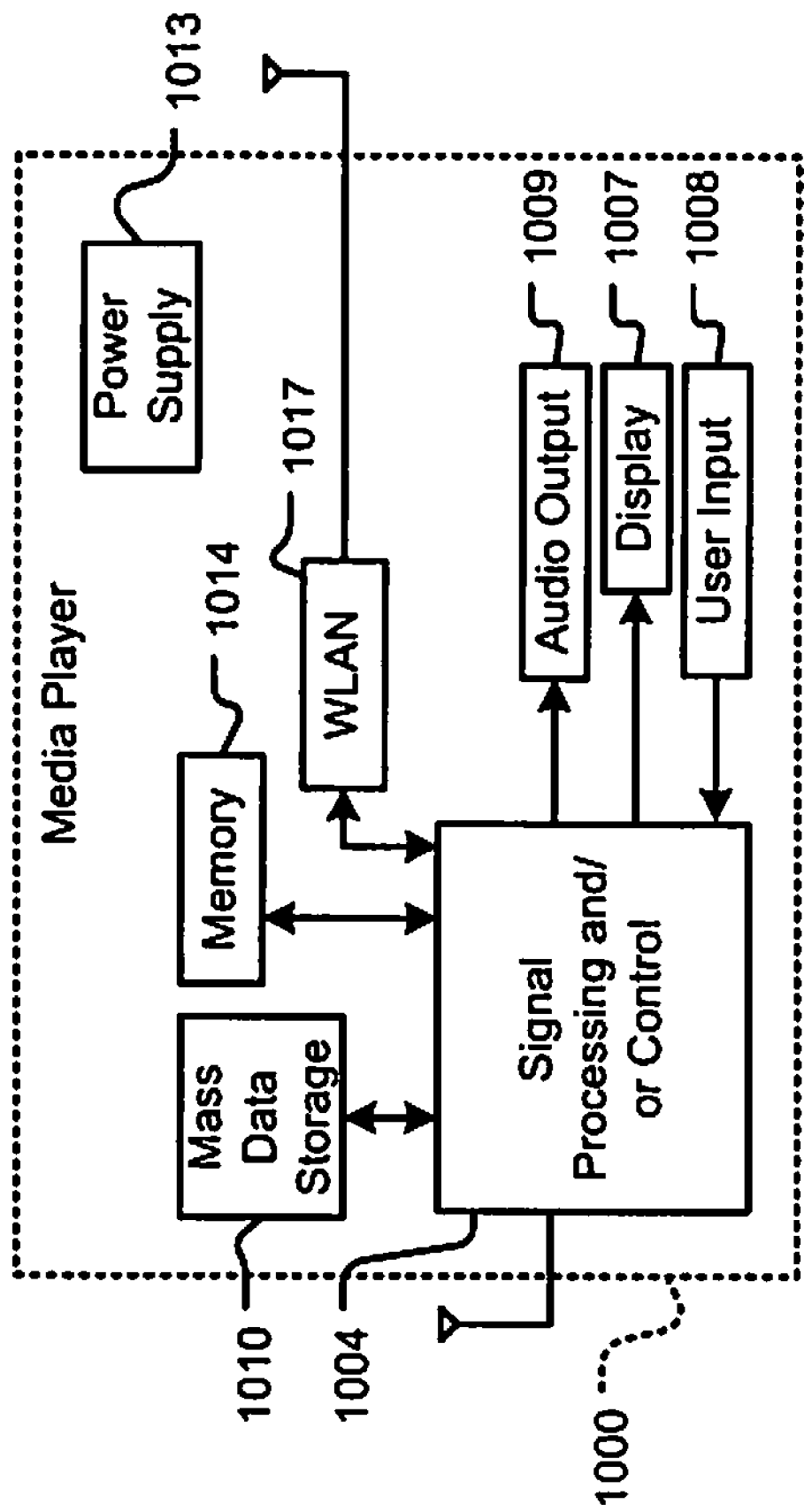
FIG. 8H is a functional block diagram of a media player.

Referring now to FIG. 8H, the memory array can be implemented in memory 1014 of a media player 1000. The memory 1014 may function with either or both signal processing and/or control circuits, which are generally identified in FIG. 8H at 1004, a WLAN interface 1017, mass data storage 1010 of the media player 1000 and/or a power supply 1013. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface with the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The media player 1000 also may support connections with a WLAN via a WLAN network interface 1017. Still other implementations in addition to those described above are contemplated.

Those skilled in the art can now appreciate from the foregoing description that the broad teachings of the disclosure can be implemented as a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A phase-change memory system, comprising:
an array of phase-change memory cells;
an amplifier that amplifies a data signal read from a selected one of the phase-change memory cells; and
a gain estimation module that adjusts a gain of the amplifier based on a gain parameter that is associated with the selected one of the phase-change memory cells, wherein the gain parameter is based on a cumulative effect of neighboring thermal events on the selected one of the phase-change memory cells.

2. The phase-change memory system of claim 1, wherein the gain parameter includes at least one of resistance and data signal magnitude.

3. The phase change memory system of claim 1, wherein each of the phase-change memory cells includes a heater.

4. The phase change memory system of claim 3, wherein the gain parameter is based on an amount of time that the heaters of one or more of the phase-change memory cells adjacent the selected one of the phase-change memory cells are activated.

5. The phase change memory system of claim 3, wherein the gain parameter is based on a number of times that the heaters of one or more of the phase-change memory cells adjacent the selected one of the phase-change memory cells are activated.

6. The phase change memory system of claim 3, wherein the gain parameter is based on estimated heat that is transferred to the selected one of the phase-change memory cells by the heaters of one or more of others of the phase-change memory cells.

7. The phase change memory system of claim 1, wherein the phase-change memory cells are divided into contiguous groups and the selected one of the phase-change memory cells is positioned on a boundary between at least two of the contiguous groups.

8. The phase change memory system of claim 7, wherein the gain parameter is based on a proximity of the boundary to the selected one of the phase-change cells.

9. The phase change memory system of claim 1, further comprising a select module for selecting a row of the array and for selecting the phase-change cells within columns of the selected row.

10. The phase change memory system of claim 1, further comprising a select module for selecting a column of the array and for selecting the phase-change cells within rows of the selected column.

11. The phase change memory system of claim 7, wherein:
the selected one of the phase-change memory cells is positioned in a first one of the contiguous groups on a boundary between the first one of the contiguous groups and a second one of the contiguous groups, and
the phase-change memory cells of the second contiguous group are written more frequently than the phase-change memory cells of the first contiguous group.

12. A method of reading data from an array of phase-change memory cells, the method comprising:
amplifying a data signal read from a selected one of the phase-change memory cells; and
adjusting a gain of the amplification based on a gain parameter that is associated with the selected one of the phase-change memory cells, wherein the gain parameter is based on a cumulative effect of neighboring thermal events on the selected one of the phase-change memory cells.

13. The method of claim 12, wherein the gain parameter includes at least one of resistance and data signal magnitude.

14. The method of claim 12, wherein the gain parameter is based on exposure of the selected one of the phase-change memory cells to heat from other ones of the phase-change memory cells.

15. The method of claim 14, wherein the gain parameter is based on duration of the exposure.

16. The method of claim 14, wherein the gain parameter is based on a number of times that the other ones of the phase-change memory cells are programmed.

17. The method of claim 12, wherein the gain parameter is based on estimated heat transferred to the selected one of the phase-change memory cells by heaters of other ones of the phase-change memory cells.

18. The method of claim 12, further comprising assigning the phase-change memory cells to respective contiguous groups, wherein the selected one of the phase-change memory cells is positioned on a boundary between at least two of the contiguous groups.

19. The method of claim 18, wherein the gain parameter is based on a proximity of the boundary to the selected one of the phase-change cells.

20. The method of claim 12, further comprising selecting a row of the array and selecting the phase-change cells within columns of the selected row.

21. The method of claim 12, further comprising selecting a column of the array and selecting the phase-change cells within rows of the selected column.

22. The method of claim 18, wherein:
the selected one of the phase-change memory cells is positioned in a first one of the contiguous groups on a boundary between the first one of the contiguous groups and a second one of the contiguous groups, and
the phase-change memory cells of the second contiguous group are written more frequently than the phase-change memory cells of the first contiguous group.

23. A phase-change memory system, comprising:
phase-change memory cell means for storing data;
amplifier means for amplifying a signal from the phase-change memory cell means; and
gain means for adjusting a gain of the amplifier means based on a gain parameter that is associated with a selected one of the phase-change memory cell means, wherein the gain parameter is based on a cumulative effect of neighboring thermal events on the selected one of the phase-change memory cell means.

24. The phase-change memory system of claim 23, wherein the gain parameter includes at least one of resistance and data signal magnitude.

25. The phase change memory system of claim 23, wherein each of the phase-change memory cell means includes heater means for heating the respective phase-change memory cell means.

26. The phase change memory system of claim 25, wherein the gain parameter is based on an amount of time that the heater means of one or more of the phase-change memory cell means adjacent the selected one of the phase-change memory cell means are activated.

27. The phase change memory system of claim 25, wherein the gain parameter is based on a number of times that the heater means of one or more of the phase-change memory cell means adjacent the selected one of the phase-change memory cell means are activated.

28. The phase change memory system of claim 23, wherein the gain parameter is based on estimated heat that is transferred to the selected one of the phase-change memory cell means by one or more heaters associated with others of the phase-change memory cell means.

29. The phase change memory system of claim 23, wherein the phase-change memory cell means are divided into contiguous groups and the selected one of the phase-change memory cell means is positioned on a boundary between at least two of the contiguous groups.

30. The phase change memory system of claim 29, wherein the gain parameter is based on a proximity of the boundary to the selected one of the phase-change memory cell means.

* * * * *